United States Patent
Dan et al.

(10) Patent No.: US 10,797,674 B2
(45) Date of Patent: Oct. 6, 2020

(54) SIGNAL ACQUISITION DEVICE FOR HIGH-VOLTAGE LOOP, DETECTOR, BATTERY DEVICE, AND VEHICLE

(71) Applicant: CONTEMPORARY AMPEREX TECHNOLOGY CO., LIMITED, Ningde (CN)

(72) Inventors: Zhimin Dan, Ningde (CN); Wei Zhang, Ningde (CN); Yizhen Hou, Ningde (CN); Jia Xu, Ningde (CN)

(73) Assignee: CONTEMPORARY AMPEREX TECHNOLOGY CO., LIMITED, Ningde (CN)

( * ) Notice: Subject to any disclaimer, the term of this patent is extended or adjusted under 35 U.S.C. 154(b) by 61 days.

(21) Appl. No.: 16/166,478

(22) Filed: Oct. 22, 2018

(65) Prior Publication Data
US 2019/0158054 A1    May 23, 2019

(30) Foreign Application Priority Data
Oct. 23, 2017    (CN) .......................... 2017 1 0994717

(51) Int. Cl.
*H03F 3/45*    (2006.01)
*H03H 7/06*    (2006.01)
(Continued)

(52) U.S. Cl.
CPC ........... *H03H 7/06* (2013.01); *G01R 19/0092* (2013.01); *G01R 19/25* (2013.01); *G01R 31/36* (2013.01);
(Continued)

(58) Field of Classification Search
CPC ...... H03H 7/06; G01R 19/25; G01R 19/0092; G01R 31/36; G01R 31/382;
(Continued)

(56) References Cited

U.S. PATENT DOCUMENTS

| | | | |
|---|---|---|---|
| 5,648,743 A | * | 7/1997 | Nagaya ..................... H03F 1/26 330/252 |
| 6,215,302 B1 | | 4/2001 | Carey |

(Continued)

FOREIGN PATENT DOCUMENTS

| | | |
|---|---|---|
| CN | 104049136 A | 9/2014 |
| CN | 203872147 U | 10/2014 |

(Continued)

OTHER PUBLICATIONS

European Search Report from corresponding European Application No. 18201825.9 dated Mar. 29, 2019.
(Continued)

*Primary Examiner* — Khanh V Nguyen
*Assistant Examiner* — Khiem D Nguyen
(74) *Attorney, Agent, or Firm* — Tucker Ellis LLP

(57) ABSTRACT

The present application provides an apparatus for processing signals of a high-voltage loop, a detector, a battery device, and a vehicle. The apparatus includes a filter circuit connected to an element to be detected and configured to filter signals from the element to be detected; a differential amplification circuit connected to the filter circuit and configured to amplify the filtered signals; and a processor connected to the differential amplification circuit and configured to process the amplified signals.

13 Claims, 4 Drawing Sheets

(51) Int. Cl.
    *G01R 31/382* (2019.01)
    *G01R 31/36* (2020.01)
    *G01R 19/00* (2006.01)
    *G01R 19/25* (2006.01)
    *G01R 31/3835* (2019.01)

(52) U.S. Cl.
    CPC ....... *G01R 31/382* (2019.01); *G01R 31/3835* (2019.01); *H03F 3/45475* (2013.01); *H03F 2200/165* (2013.01); *H03F 2203/45022* (2013.01); *H03F 2203/45151* (2013.01)

(58) Field of Classification Search
    CPC ............. G01R 31/3835; H03F 3/45475; H03F 2203/45151; H03F 2203/45022; H03F 2200/165
    USPC .................................................. 330/252–261
    See application file for complete search history.

(56) References Cited

U.S. PATENT DOCUMENTS

2013/0271216 A1   10/2013   Liu et al.
2014/0176149 A1    6/2014   Mizoguchi

FOREIGN PATENT DOCUMENTS

| | | |
|---|---|---|
| CN | 103616648 B | 5/2016 |
| EP | 2966460 A1 | 1/2016 |
| EP | 3214452 A1 | 9/2017 |
| WO | 2013161870 A1 | 10/2013 |

OTHER PUBLICATIONS

Office Action from corresponding Chinese Application No. 201710994717.6 dated May 31, 2019.

Klutgen, Michael, "Managing high-voltage lithium-ion batteries in HEVs", Linear Technology Corp, Apr. 2009, [retrieved online] <http://cds.linear.com/docs/en/article/EDN%20M%20Kultgen%20LTC6802.pdf>.

Jeschke, Dr. Ing.S. et al., "Development of a passive impedance network for modeling electric vehicle traction batteries for EMI measurements", 2017 International Symposium on Electromagnetic Compatibility, Sep. 2017, pp. 1-6.

Jongkwang Lim, "Control practice of electromagnetic environmental effects for hybrid electric vehicles", 2015 IEEE 2nd International Future Energy Electronics Conference, Nov. 2015, pp. 1-5.

\* cited by examiner

SIGNAL ACQUISITION DEVICE FOR HIGH-VOLTAGE LOOP, DETECTOR, BATTERY DEVICE, AND VEHICLE

CROSS-REFERENCE TO RELATED APPLICATIONS

The present application claims priority to Chinese Patent Application No. 201710994717.6, filed on Oct. 23, 2017, the content of which is incorporated herein by reference in its entirety.

FIELD

The present application relates to the battery fields and, more particularly to an apparatus for processing signals of a high-voltage loop. The present application further relates to a detector, a battery device, and a vehicle including an apparatus for processing signals of a high-voltage loop.

BACKGROUND

Currently, more and more electric vehicles and hybrid electric vehicles come into the daily life. As a result, the safety of the power battery in the vehicle, such as the electric vehicle and the hybrid electric vehicle, becomes more important.

During use of a vehicle, the environment for a high-voltage loop of a power battery of the vehicle can be complicated and variable. For example, devices such as cellphone and internal electric motor in the vehicle can result an environment where electromagnetic interference is in a range of a low frequency to an ultrahigh frequency. This can cause electromagnetic interference to the high-voltage loop of the power battery. In the existing technologies, a current of the high-voltage loop of the battery is detected based on a change of a magnetic field due to a change of the current. For example, flux-gate current detection devices and magnetic-resistant current detection devices measure a current according to a mutual conversion relation of the current and the magnetic field. Consequently, the electromagnetic interference can affect detection accuracy of the high-voltage loop, and the real current value may not be accurately detected. If it is not accurately detected that the real current value is outside a safety range, this will greatly decrease the safety of the battery. Moreover, for a current detection device based on the electromagnetic effect, when there is a need to increase the current measurement range, it is necessary to increase the volume of the current detection device, which requires a higher supply voltage and higher power consumption with higher manufacturing and operation costs.

Therefore, it would be desired to have a current detection method for the power battery of a vehicle that is relatively less affected by the electromagnetic interference.

SUMMARY

The present application provides an apparatus for processing signals of device, a detector, a battery device, and a vehicle, so as to solve a problem that the current detection in the high-voltage loop of the power battery in a vehicle is inaccurate. In the present application, the accuracy of current detection is improved, which enables improved overall performance and reliability of the power battery of the vehicle.

In a first aspect, the present application provides an apparatus for processing signals of a high-voltage loop, including: a filter circuit configured to filter a signal from an element to detected; a differential amplification circuit configured to amplify the filtered signal; and a processor configured to process the amplified signal. The filter circuit connects to the element to be detected. The differential amplification circuit connects to the filter circuit. The processor connects to the differential amplification circuit.

Optionally, the differential amplification circuit includes a first transistor, a second transistor, and a common-mode suppression element; wherein a first end of the common-mode suppression element connects to an emitter of the first transistor and an emitter of the second transistor, a second end of the common-mode suppression element connects to a low-voltage power supply.

Optionally, the common-mode suppression element is a common-mode suppression resistor.

Optionally, a resistance value of the common-mode suppression resistor is greater than 100 kΩ.

Optionally, the common-mode suppression element is a constant-current source circuit.

Optionally, the constant-current source circuit includes a third transistor, a first resistor, a second resistor, and a third resistor, a collector of the third transistor connects to the emitter of the first transistor and the emitter of the second transistor, a base of the third transistor connects to a first end of the first resistor and a first end of the second resistor, and an emitter of the third transistor connects to a first end of the third resistor; a second end of the first resistor is grounded; a second end of the second resistor connects to the low-voltage power supply; and a second end of the third resistor connects to the low-voltage power supply.

Optionally, each of the first transistor, the second transistor, and the third transistor is a field-effect transistor and/or a triode transistor.

Optionally, the element to be detected is a current divider in the high-voltage loop, the current divider includes an internal resistor, two ends of the internal resistor connect to a first input end of the filter circuit and a second input end of the filter circuit, respectively.

Optionally, the filter circuit includes: a first electrostatic protection element, a first end of the first electrostatic protection element connects to the first input end of the filter circuit, a second end of the first electrostatic protection element is grounded; and/or a second electrostatic protection element, a first end of the second electrostatic protection element connects to the second input end of the filter circuit, a second end of the second electrostatic protection element is grounded.

Optionally, each of the first electrostatic protection element and the second electrostatic protection element includes one or more electrostatic protection capacitors.

Optionally, the filter circuit further includes a common-mode filter element, the common-mode filter element includes a fourth resistor, a first filter capacitor, a fifth resistor, and a second filter capacitor; wherein a first end of the fourth resistor connects to the first input end of the filter circuit, and a second end of the fourth resistor connects to a first end of the first filter capacitor; a second end of the first filter capacitor is grounded; a first end of the fifth resistor connects to the second input end of the filter circuit, a second end of the fifth resistor connects to a first end of the second filter capacitor; and a second end of the second filter capacitor is grounded.

Optionally, the filter circuit further includes a differential-mode filter element, the differential-mode filter element includes the fourth resistor, the fifth resistor, and a third filter capacitor; wherein a first end of the third filter capacitor connects to a second end of the fourth resistor and a first input end of the differential amplification circuit, and a second end of the third filter capacitor connects to a second end of the fifth resistor and a second input end of the differential amplification circuit.

In a second aspect, the apparatus further includes: the element to be detected.

In a third aspect, the present application provides a detector including an apparatus for processing signals of a high-voltage loop according to any one of the above aspects.

In a fourth aspect, the present application provides a battery device including an apparatus for processing signals of a high-voltage loop according to any one of the above aspects.

In a fifth aspect, the present application provides a vehicle including an apparatus for processing signals of a high-voltage loop according to any one of the above aspects.

The above technical solutions aim to solve a problem that the current detection in the high-voltage loop of the power battery in the vehicle is inaccurate and improve the accuracy of the current detection in the high-voltage loop.

The element to be detected can include, but is not limited to, a current divider. To be more specific, the filter circuit can connect to two ends of the element to be detected in the high-voltage loop and the filter circuit can filter the electromagnetic interference. After the electromagnetic interference is filtered by the filter circuit, the original signals may be attenuated. To prevent the accuracy of current detection from being affected by the attenuated signals, a differential amplification circuit connects to the filter circuit and the filtered signals can be amplified by the differential amplification circuit. This can ensure that a processor accurately calculates a current value according to the signals amplified by the differential amplification circuit.

With the above-mentioned solutions of the present application, the capability of anti-electromagnetic interference in the current detection process of the high-voltage loop of the power battery of a vehicle can be improved, which enables improved accuracy of current detection and improved overall performance and reliability of the power battery of the vehicle.

BRIEF DESCRIPTION OF DRAWINGS

The accompanying drawings, which are incorporated herein and form part of the specification, illustrate the present application and, together with the description, further serve to explain the principle(s) of the present application and to enable the skilled person in the relevant art(s) to make and use the invention. Embodiments of the present application are described, by way of example only, with reference to the accompanying drawings.

DETAILED DESCRIPTION OF EXEMPLARY EMBODIMENTS

For better understanding of the technical solutions of the present application, the embodiments of the present application are further described in details with reference to the accompanying drawings.

It will be appreciated that the described embodiments are only some exemplary embodiments of the present application, not all of the embodiments. Based on the described embodiments in the present application, all other embodiments that can be obtained without creative work by those of ordinary skill in the art falls into the protection scope of the present application, as defined in the appended claims.

The terms used in the embodiments of the present application are merely for the purpose of describing some exemplary embodiments, which are not intended to limit the present application. The terms of "a", "an", and "the" in a singular form as mentioned in the present specification and claims are also intended to cover a plural form, unless another definition in the context is otherwise specifically stated.

Figure 1A:
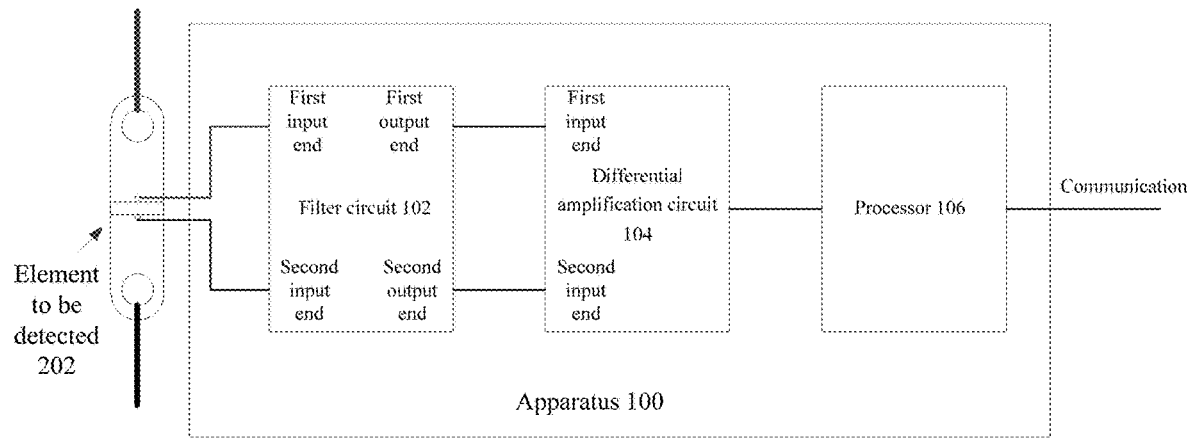
FIG. 1A illustrates a block diagram of an apparatus for processing signals of a high-voltage loop according to an exemplary embodiment of the present application.

FIG. 1A illustrates a block diagram of an apparatus for processing signals of a high-voltage loop according to an embodiment of the present application.

As shown in FIG. 1A, an apparatus 100 for processing signals of a high-voltage loop according to an embodiment of the present application includes a filter circuit 102, a differential amplification circuit 104, and a processor 106.

The filter circuit 102 is configured to filter signals from an element to be detected 202, and a first input end and a second input end of the filter circuit 102 are connected to two ends of the element to be detected 202, respectively. The differential amplification circuit 104 is configured to amplify the filtered signals, a first input end and a second input end of the differential amplification circuit 104 are connected to a first output end of the filter circuit 102 and a second output end of the filter circuit 102, respectively, and an output end of the differential amplification circuit 104 is connected to the processor 106. The processor 106 is configured to process the amplified signals, communicate with a peripheral system such as battery management system etc., and send a result of the current detection to the peripheral system for further processing.

Specifically, the two ends of the element to be detected 202 of the high-voltage loop can be connected to the filter circuit 102, respectively, to filter the electromagnetic interference by the filter circuit 102. After the electromagnetic interference is filtered by the filter circuit 102, the original signals may be weakened or attenuated. To prevent the accuracy of current detection from being affected by the weakened or attenuated the signals, the differential amplification circuit 104 can be connected to the filter circuit 102 and the filtered signals can be amplified by the differential amplification circuit 104. This can make sure that the processor 106 accurately calculates a current value according to the amplified signals.

Moreover, if a current detection result is not accurate, this may cause that the detected current value is lower than the real current value and a threshold for triggering a cut-off of the high-voltage loop is deemed as being not reached, which can result that when the real current value is too high and the high-voltage loop should be cut off. As a result, the high-voltage circuit and even the whole power battery cannot be cut off in time. Therefore, filtering the electromagnetic interference can improve the accuracy of the current detection.

By the above technical solution, the capability of anti-electromagnetic interference during the current detection process in the high-voltage loop for the power battery of the vehicle (such as a car) is improved, the accuracy of the current detection is then improved, and an overall performance and reliability of the power battery and the vehicle are improved accordingly.

Figure 1B:
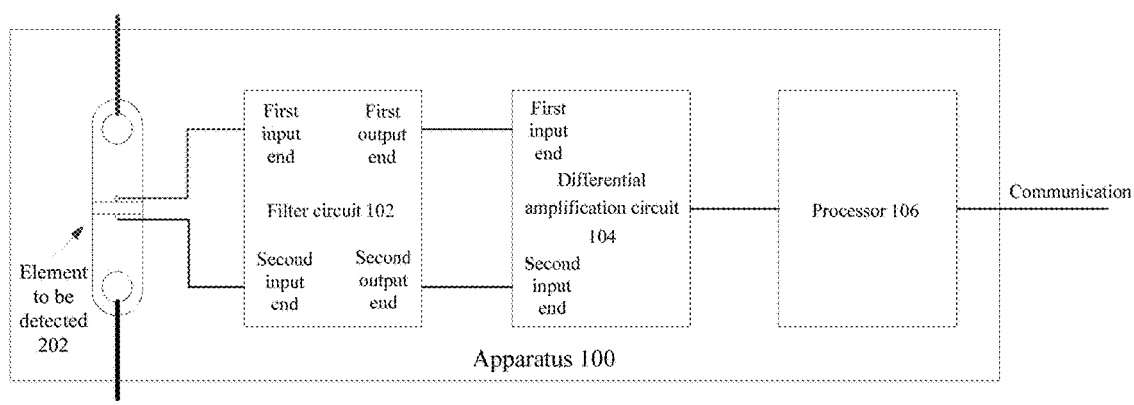
FIG. 1B illustrates a block diagram of an apparatus for processing signals of a high-voltage loop according to another exemplary embodiment of the present application.

FIG. 1B illustrates a block diagram of an apparatus for processing signals of the high-voltage loop according to another embodiment of the present application.

As shown in FIG. 1B, based on the structure illustrated in FIG. 1A, the apparatus for processing signals of a high-voltage loop can further include an element to be detected 202. Two ends of the element to be detected 202 are connected to the first input end of the filter circuit 102 and the second input end of the filter circuit 102, respectively.

That is, in an actual scenario, a form of the apparatus for processing signals of a high-voltage loop can be an integrated apparatus as shown in FIG. 1A, which is connected into the high-voltage loop by connection to the element to be detected 202 of the high-voltage loop. Alternatively, as shown in FIG. 1B, a form of the apparatus for processing signals of a high-voltage loop can be an integrated current detector that includes the element to be detected 202 and is directly connected to the high-voltage loop for current detection.

In one embodiment of the present application, the element to be detected 202 is a current divider in the high-voltage loop. The current divider includes an internal resistor, and two ends of the internal resistor are respectively connected to the first input end of the filter circuit 102 and the second input end of the filter circuit 102. More specifically, after a voltage signal is drawn via the two ends of the internal resistor, the voltage signal is filtered and differentially amplified to achieve the electromagnetic interference filtering and signal amplification and fidelity. Therefore, the processor 106 can obtain more accurate voltage signals. As a result, the processor 106 can calculate a voltage difference between the two ends of the internal resistor, which is then divided by a resistance value of the internal resistor so as to obtain an accurate current value.

In addition, the apparatus 100 for processing signals of a high-voltage loop further includes an analog-to-digital (A/D) converter. The A/D converter can be integrated in the processor 106 as a part of the processor 106. Alternatively, the A/D converter can be an individual component placed between the differential amplification circuit 104 and the processor 106 and is configured to convert a received analog signal into a digital signal for further processing by the processor 106.

Figure 2:
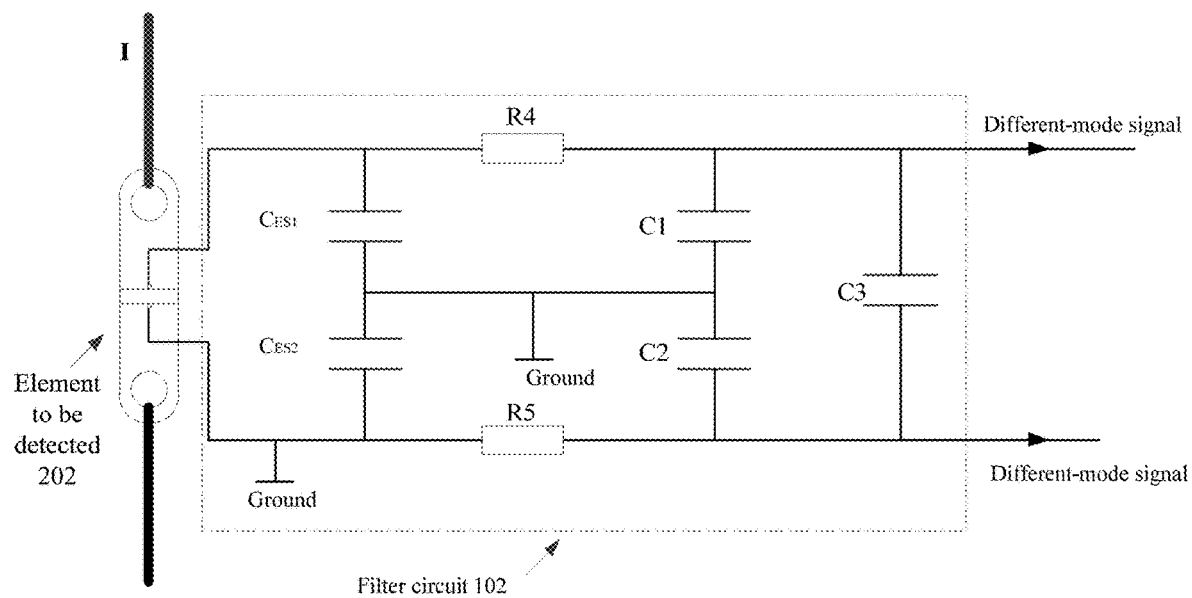
FIG. 2 illustrates a circuit diagram of a filter circuit according to an exemplary embodiment of the present application.

FIG. 2 illustrates a circuit diagram of a filter circuit according to an embodiment of the present application.

As shown in FIG. 2, the filter circuit 102 includes a first electrostatic protection element $C_{ES1}$ and/or a second electrostatic protection assembly $C_{ES2}$. A first end of the first electrostatic protection element $C_{ES1}$ is connected to the first input end of the filter circuit 102. A second end of the first electrostatic protection element $C_{ES1}$ is grounded. A first end of the second electrostatic protection element $C_{ES2}$ is connected to the second input end of the filter circuit 102. A second end of the second electrostatic protection element $C_{ES2}$ is grounded.

As the body or housing of the element to be detected 202 such as the current divider is usually made of metal, this can cause an electrostatic interference. Further, as a circuit branch extends from each of the two ends of the internal resistor of the current divider, it is desired to have electrostatic protection for each circuit branch where an electrostatic protection element is arranged to filter the electrostatic interference.

In one embodiment of the present application, the electrostatic protection element includes but is not limited to be an electrostatic protection capacitor. Though the electrostatic voltage can be high, its energy is low. Therefore, an electrostatic protection capacitor that can withstand a high voltage should be selected, instead of a capacitor with a high capacitance value. This can reduce the cost of the electrostatic protection capacitor.

In one embodiment of the present application, each of the first electrostatic protection element $C_{ES1}$ and the second electrostatic protection element $C_{ES2}$ includes one or more electrostatic protection capacitors. If more electrostatic protection capacitors are included in each of electrostatic protection elements, the filtering capability of the electrostatic interference is stronger. While fewer electrostatic protection capacitors are included in each of electrostatic protection elements, the level of signal attenuation of the signals is lower, which can facilitate signal transmission.

As shown in FIG. 2, the filter circuit 102 further includes a common-mode filter element. The common-mode filter element includes a fourth resistor R4, a first filter capacitor C1, a fifth resistor R5, and a second filter capacitor C2. A first end of the fourth resistor R4 is connected to the first input end of the filter circuit 102. A second end of the fourth resistor R4 is connected to a first end of the first filter capacitor C1. A second end of the first filter capacitor C1 is grounded. A first end of the fifth resistor R5 is connected to the second input end of the filter circuit 102, and a second end of the fifth resistor R5 is connected to a first end of the second filter capacitor C2. A second end of the second filter capacitor C2 is grounded.

The above-described common-mode filter element is to mainly suppress a common-mode signal. When the common-mode signal passes through the fourth resistor R4 and the fifth resistor R5, the fourth resistor R4 and the fifth resistor R5 can generate magnetic fields in a same direction, which results in an increase of an inductance value of the fourth resistor R4 and the fifth resistor R5. In other words, an inductive reactance of the fourth resistor R4 and the fifth resistor R5 to the common-mode signal increases. Consequently, this enables the common-mode signal to be more significantly suppressed, thereby attenuating the common-mode signal and suppressing the noise of common-mode interference. In addition, the first filter capacitor C1 and the second filter capacitor C2 act as a function of filtering the noise of common-mode interference, which also allows the common-mode interference to be significantly suppressed.

In the above-described embodiments of the present application, the filter circuit 102 optionally further includes a differential-mode filter element. The differential-mode filter element includes a fourth resistor R4 and a fifth resistor R5, and further includes a third filter capacitor C3. A first end of the third filter capacitor C3 is connected to a second end of the fourth resistor R4 and the first input end of the differential amplification circuit 104. A second end of the third filter capacitor C3 is connected to a second end of the fifth resistor R5 and the second input end of the differential amplification circuit 104.

The above-described differential-mode filter element is to mainly suppress differential-mode signal. The fourth resistor R4 and the fifth resistor R5 are connected with the third filter capacitor C3 in series to form a loop. As the fourth resistor R4 and the fifth resistor R5 have a high inductive reactance to the differential-mode high frequency interference, and the third filter capacitor C3 has a small capacitive reactance to the high frequency interference, this allows the differential-mode signal to be filtered to reduce the differential-mode interference noise, thereby suppressing the differential-mode interference noise.

A resistance value of the fourth resistor R4 is same as a resistance value of the fifth resistor R5. A resistance value of the first filter capacitor C1 is same as a resistance value of the second filter capacitor C2.

Common-mode filter parameters of the filter circuit formed by the fourth resistor R4 and the first filter capacitor C1 are as follows:
Time constant: $\tau_{Icm}$=R4×C1
Filter cutoff frequency:

$$f_{Icm} = \frac{1}{2\pi \tau_{Icm}} = \frac{1}{2\pi \times R4 \times C1}$$

Parameters of the filter circuit 102 of the differential-mode interference signal are calculated as follows:
Time constant: $\tau_{cutI}$=R4×(C1+2C3)
Filter cutoff frequency:

$$f_{cutI} = \frac{1}{2\pi \tau_{cutI}} = \frac{1}{2\pi \times R4 \times (C1 + 2C3)}.$$

The filter frequency of a post-stage circuit and a sampling frequency of the signal should be taken into account to determine the specific parameters. For example, if the current sampling value should be integrated to calculate SOC, 3-5 $\tau_{cutI}$ are proposed to be close to the value of sampling frequency T=1/$f_{cutI}$.

Figure 3:
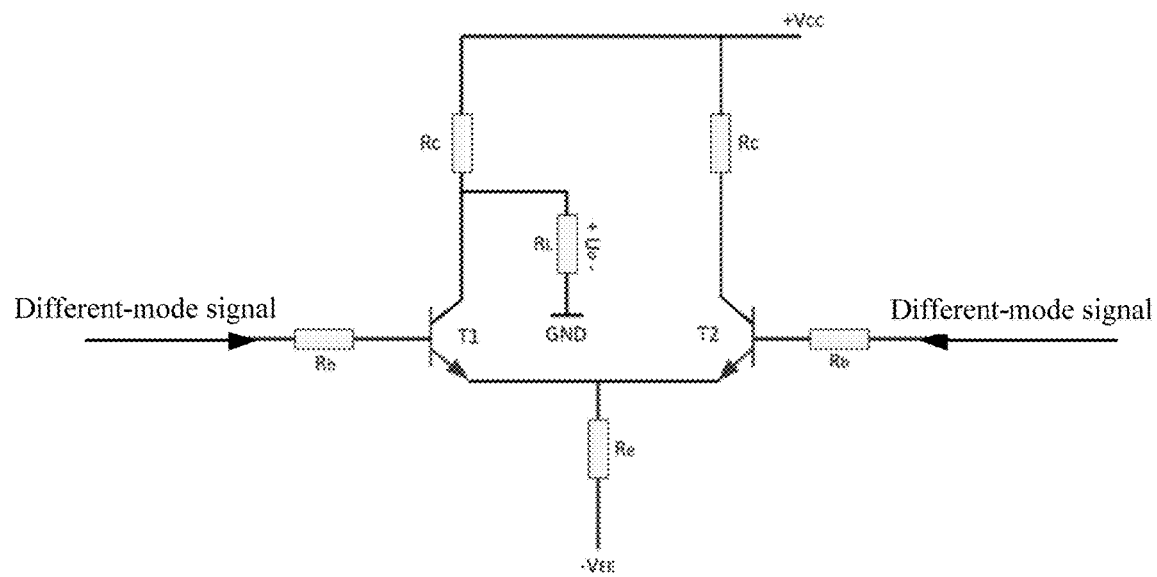
FIG. 3 illustrates a circuit diagram of a differential amplification circuit according to an exemplary embodiment of the present application.
Figure 4:
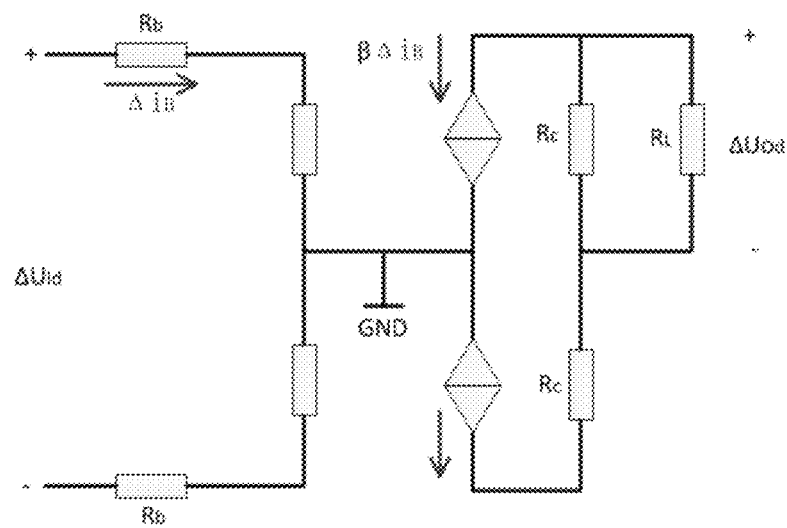
FIG. 4 illustrates an circuit diagram that is an equivalent circuit for a differential-mode signal according to an exemplary embodiment of the present application.

With the above-described circuit, by reference to FIGS. 3 and 4, the differential amplification circuit 104 includes a first transistor T1, a second transistor T2, and a common-mode suppression element. A first end of the common-mode suppression element is connected to an emitter of the first transistor T1 and an emitter of the second transistor T2. A second end of the common-mode suppression element is connected to a low-voltage power supply. The low-voltage power supply herein can be an individual peripheral power supply or a storage battery of the vehicle.

In some embodiments of the present application, the signal is differentially amplified. Further, the resistors in the differential amplification circuit and/or other resistors in the apparatus 100 for processing signals of the high-voltage loop can change with an increase of the temperature. For example, a resistance value of a thermistor with a negative temperature coefficient can decrease with an increase of the temperature. This can cause a poor stability of the overall circuits.

The temperature change and the common-mode interference can cause the collector current of each transistor in the differential amplification circuit 104 to change. Thus, when the common-mode interference is suppressed, there is a bonus effect that the temperature interference can also be suppressed. When the collector current of each transistor in the differential amplification circuit 104 changes, a voltage drop of $R_e$ changes. With the differential-mode signal and the common-mode signal, a voltage of the load resistor changes. FIG. 4 shows an equivalent circuit for the differential-mode signal, where An output voltage $\Delta u_{Od}$=-$\Delta i_C$($R_c$/$R_L$), an input voltage $u_{Id}$=2×$\Delta i_B$($R_b$+$r_{be}$), $i_C$ refers to a collector current, $i_B$ refers to base current, $R_c$ refers to resistance on the collector, $R_L$ refers to load resistor, $r_{be}$ refers to resistance between the base and an emitter of a triode transistor.

It can be derived that a differential-mode amplification coefficient is $$A_d = \frac{\Delta u_{Od}}{\Delta u_{Id}} = -\frac{1}{2} \times \frac{\beta(R_c//R_L)}{R_b + r_{be}},$$

where $\beta$ refers to an amplification coefficient of the triode transistor, and $$\beta = \frac{\Delta i_C}{\Delta i_B}.$$

Similarly, it can be derived that
a common-mode amplification coefficient is $$A_c = \frac{\Delta u_{Od}}{\Delta u_{Id}} = -\frac{\beta(R_c//R_L)}{R_b + r_{be} + 2(1+\beta)R_e}$$

where $R_e$ refers to a resistance at the emitter of the triode transistor.

An equation of a common-mode suppression ratio $K_{CMR}$ can be obtained by the above two equations of the differential-mode amplification coefficient and the common-mode amplification coefficient:

$$K_{CMR} = \left|\frac{A_d}{A_c}\right| = \frac{R_b + r_{be} + 2(1+\beta)R_e}{2(R_b + r_{be})}$$

It can be seen that the greater $R_e$ is, the smaller $A_c$ is, the greater $K_{CMR}$ is, and the better performance the circuit has. Thus, by increasing the resistance $R_e$ of the emitter, the common-mode suppression ratio and the suppression of the common-mode interference can be improved, and the temperature interference on the first transistor T1 and the second transistor T2 can also be effectively suppressed.

In one embodiment of the present application, the common-mode suppression element includes but is not limited to the common-mode suppression resistors, and can also include other components, such as an inductor. The resistance value of the common-mode suppression resistor is greater than 100 kΩ and can also be other values to meet actual requirements. When the common-mode suppression resistor is great enough, the common-mode suppression ratio $K_{CMR}$ is then great enough accordingly, thereby enabling the temperature interference to be suppressed.

In one embodiment of the present application, the common-mode suppression element is a constant-current source circuit. The resistance of the constant-current source circuit is almost infinite. Therefore, there is a very big common-mode suppression ratio $K_{CMR}$ for suppressing the temperature interference. It could be understood that the constant-current source circuit includes but is not limited to the common-mode suppression element as described in the present application, and any specific circuit to be described hereinafter, which can be any type of a circuit structure as long as it can provide a very big common-mode suppression ratio $K_{CMR}$.

Figure 5:
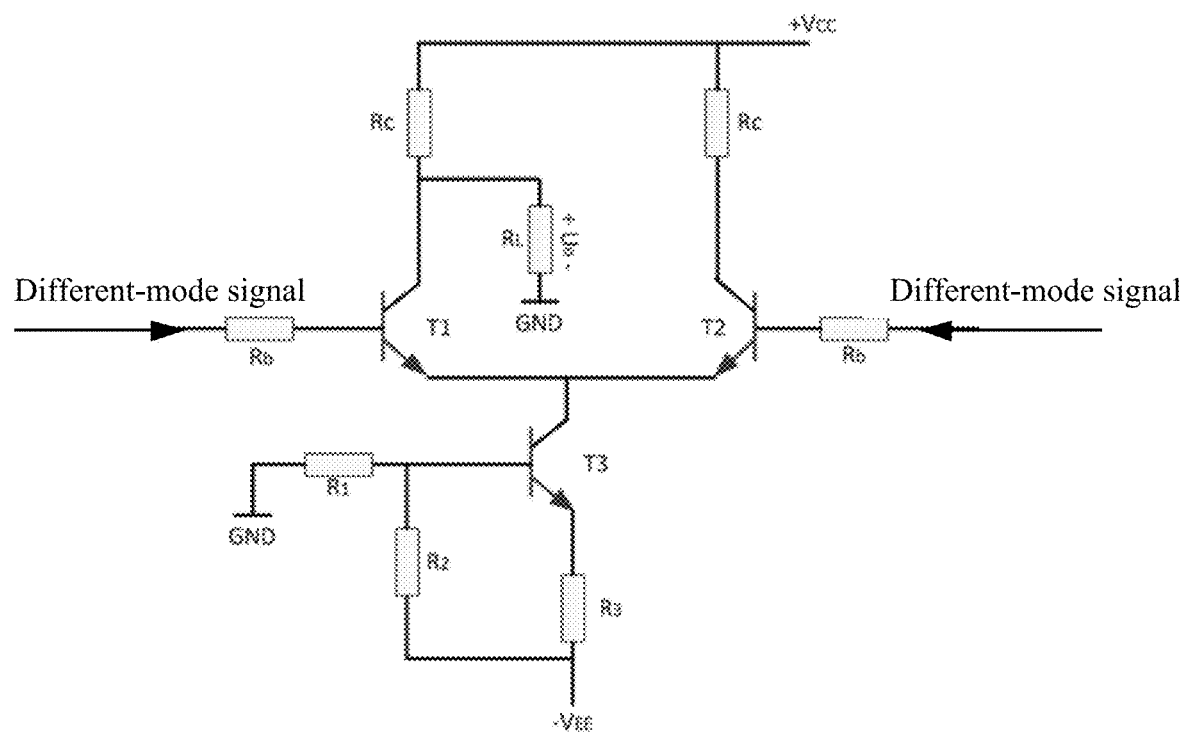
FIG. 5 illustrates a circuit diagram of a differential amplification circuit according to another exemplary embodiment of the present application.

FIG. 5 illustrates a circuit diagram of a differential amplification circuit 104 according to another embodiment of the present application.

As shown in FIG. 5, $R_e$ can be replaced with a third transistor T3 that is operated in a stable circuit. Thus, the common-mode suppression element includes the third transistor T3, a first resistor R1, a second resistor R2 and a third resistor R3. A collector of the third transistor T3 is connected to the emitter of the first transistor T1 and the emitter of the second transistor T2. A base of the third transistor T3 is connected to the first end of the first resistor R1 and the first end of the second resistor R2. An emitter of the third transistor T3 is connected to the first end of the third resistor R3. The second end of the first resistor R1 is grounded. The second end of the second resistor R2 is connected to the low-voltage power supply. The second end of the third resistor R3 is connected to the low-voltage power supply.

The third transistor T3, the first resistor R1, the second resistor R2, and the third resistor R3 form a circuit that works at a stable point.

The current passing through the second resistor R2 is approximately equal to the current passing through the first resistor R1. The voltage on the second resistor R2 is a voltage divider of the first resistor R1 and the second resistor R2. That is, the base current of the third transistor T3 is very small, and the current on the collector and the current on the emitter of the third transistor T3 are substantially the same. Therefore, the third transistor T3 can be approximately considered as a constant-current source circuit with an infinitely great internal resistance, which results that the common-mode amplification coefficient $A_c$ is 0 and thus the common-mode suppression ratio is infinitely great.

It should be noted that in any one of the above described embodiments, the parameters of any component in each circuit can be in any value that is determined according to actual requirements. In addition, in any one of the above described embodiments, each of the first transistor T1, the second transistor T2, and the third transistor T3 can be any one of a field-effect transistor, triode transistor, and any other type of transistors. which allows a wider range of current detection devices to be selected and decreases the production cost.

Figure 6:
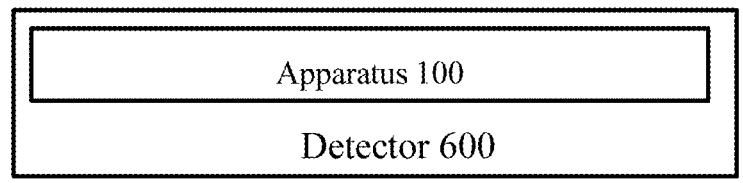
FIG. 6 illustrates a block diagram of a detector according to an exemplary embodiment of the present application.

FIG. 6 illustrates a block diagram of a detector according to an embodiment of the present application.

As shown in FIG. 6, a detector 600 according to an embodiment of the present application includes an apparatus 100 for processing signals of a high-voltage loop according to any one of the embodiments as described above. Therefore, that the detector 600 has a same effect as that of the apparatus 100 for processing signals of a high-voltage loop according to any one of the embodiments as described above, which will be not repeated herein. The detector 600 includes but is not limited to a current detector.

Figure 7:
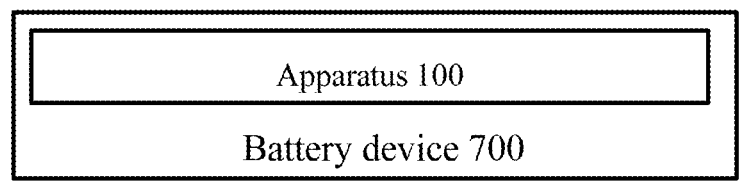
FIG. 7 illustrates a block diagram of a battery device according to an exemplary embodiment of the present application.

FIG. 7 illustrates a block diagram of a battery device according to an embodiment of the present application.

As shown in FIG. 7, a battery device 700 according to an embodiment of the present application includes the an apparatus 100 for processing signals of a high-voltage loop according to any one of the embodiments as described above. Therefore, the battery device 700 has a same effect as that of the apparatus 100 for processing signals of a high-voltage loop according to any one of the embodiments as described above, which will be not repeated herein.

Figure 8:
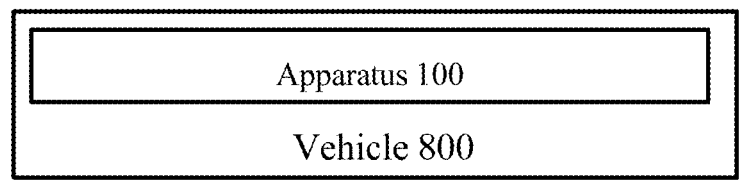
FIG. 8 illustrates a block diagram of a vehicle according to an exemplary embodiment of the present application.

FIG. 8 illustrates a block diagram of a vehicle according to an embodiment of the present application.

As shown in FIG. 8, a vehicle 800 according to one embodiment of the present application includes the apparatus 100 for processing signals of a high-voltage loop according to any one of the embodiments as described above. Therefore, the vehicle 800 has a same technical effect as that of the apparatus 100 for processing signals of a high-voltage loop according to any one of the embodiments as described above, which will be not repeated herein. The vehicle 800 includes but is not limited to an electric vehicle or a hybrid electric vehicle.

Some technical solutions of the present application are illustrated in details with reference to the drawings. With these technical solutions of the present application, the capability of anti-electromagnetic interference during the current detection process in the high-voltage loop of the power battery of the vehicle can be enhanced. Consequently, the accuracy of current detection is improved, thereby increasing the overall performance and reliability of the power battery and the vehicle.

It should be understood that, the term "and/or" used herein refers to a relation for describing associated objects and means that there can have three kinds of relations. For example, A and/or B can mean three situations: A exists individually, both A and B exist, and B exists individually. In addition, character "/" herein generally refers to an "or" relation between a former and latter associated objects.

The above description is merely illustrative of some embodiments of the present application, but is not intended to limit the present application. Any modifications, and equivalent substitutions and changes etc., are included within the scope of protection of the present application as defined by the appended claims.

The invention claimed is:

1. An apparatus for processing signals of a high-voltage loop, comprising:
   a filter circuit configured to filter a signal from an element to be detected in the high-voltage loop;
   a differential amplification circuit configured to amplify the filtered signal; and
   a processor configured to process the amplified signal;
   wherein the filter circuit connects to the element to be detected, the differential amplification circuit connects to the filter circuit, and the processor connects to the differential amplification circuit,
   wherein the filter circuit further comprises a common-mode filter element, the common-mode filter element comprises a fourth resistor, a first filter capacitor, a fifth resistor, and a second filter capacitor;
   wherein a first end of the fourth resistor connects to the first input end of the filter circuit, and a second end of the fourth resistor connects to a first end of the first filter capacitor;
   a second end of the first filter capacitor is grounded;

a first end of the fifth resistor connects to the second input end of the filter circuit, a second end of the fifth resistor connects to a first end of the second filter capacitor; and
a second end of the second filter capacitor is grounded,
wherein the filter circuit further comprises a differential-mode filter element, the differential-mode filter element comprises the fourth resistor, the fifth resistor, and a third filter capacitor; and
wherein a first end of the third filter capacitor connects to a second end of the fourth resistor and a first input end of the differential amplification circuit, and a second end of the third filter capacitor connects to a second end of the fifth resistor and a second input end of the differential amplification circuit.

2. The apparatus according to claim 1, wherein the differential amplification circuit comprises a first transistor, a second transistor, and a common-mode suppression element;
wherein a first end of the common-mode suppression element connects to an emitter of the first transistor and an emitter of the second transistor, a second end of the common-mode suppression element connects to a low-voltage power supply.

3. The apparatus according to claim 2, wherein the common-mode suppression element is a common-mode suppression resistor; and,
wherein optionally a resistance value of the common-mode suppression resistor is greater than 100 kΩ.

4. The apparatus according to claim 2, wherein the common-mode suppression element is a constant-current source circuit.

5. The apparatus according to claim 4, wherein the constant-current source circuit comprises a third transistor, a first resistor, a second resistor, and a third resistor;
wherein a collector of the third transistor connects to the emitter of the first transistor and the emitter of the second transistor, a base of the third transistor connects to a first end of the first resistor and a first end of the second resistor, and an emitter of the third transistor connects to a first end of the third resistor;
wherein a second end of the first resistor is grounded;
wherein a second end of the second resistor connects to the low-voltage power supply; and
wherein a second end of the third resistor connects to the low-voltage power supply.

6. The apparatus according to claim 5, wherein each of the first transistor, the second transistor, and the third transistor is one of a field-effect transistor and a triode transistor.

7. The apparatus according to claim 1, wherein the element to be detected is a current divider in the high-voltage loop, the current divider comprises an internal resistor, two ends of the internal resistor connect to a first input end of the filter circuit and a second input end of the filter circuit, respectively.

8. The apparatus according to claim 7, wherein the filter circuit comprises:
a first electrostatic protection element, a first end of the first electrostatic protection element connects to the first input end of the filter circuit, a second end of the first electrostatic protection element is grounded; and/or
a second electrostatic protection element, a first end of the second electrostatic protection element connects to the second input end of the filter circuit, a second end of the second electrostatic protection element is grounded.

9. The apparatus according to claim 8, wherein each of the first electrostatic protection element and the second electrostatic protection element comprises one or more electrostatic protection capacitors.

10. The apparatus according to claim 1, further comprising:
the element to be detected in the high-voltage loop.

11. A detector, comprising the apparatus according to claim 1.

12. A battery device, comprising the apparatus according to claim 1.

13. A vehicle, comprising the apparatus according to claim 1.

* * * * *